United States Patent
Lipkin et al.

(10) Patent No.: US 8,051,665 B2
(45) Date of Patent: Nov. 8, 2011

(54) HIGH EFFICIENCY THERMOELECTRIC COOLER CONTROL SYSTEM

(75) Inventors: Ziv Lipkin, Cupertino, CA (US); Jingcheng Zhang, Saratoga, CA (US)

(73) Assignee: Finisar Corporation, Sunnyvale, CA (US)

( * ) Notice: Subject to any disclaimer, the term of this patent is extended or adjusted under 35 U.S.C. 154(b) by 995 days.

(21) Appl. No.: 11/955,292

(22) Filed: Dec. 12, 2007

(65) Prior Publication Data

US 2008/0159348 A1    Jul. 3, 2008

Related U.S. Application Data

(60) Provisional application No. 60/869,707, filed on Dec. 12, 2006.

(51) Int. Cl.
*F25B 21/02* (2006.01)
(52) U.S. Cl. ............................................. 62/3.7; 62/3.2
(58) Field of Classification Search ............ 62/3.2, 62/3.3, 3.6, 3.7, 259.2
See application file for complete search history.

(56) References Cited

U.S. PATENT DOCUMENTS

| | | | | |
|---|---|---|---|---|
| 5,689,957 A | * | 11/1997 | DeVilbiss et al. | 62/3.7 |
| 5,885,378 A | * | 3/1999 | Komada et al. | 148/442 |
| 6,205,790 B1 | * | 3/2001 | Denkin et al. | 62/3.7 |
| 7,782,002 B2 | * | 8/2010 | Cook, II | 318/471 |

* cited by examiner

*Primary Examiner* — Melvin Jones
(74) *Attorney, Agent, or Firm* — Maschoff Gilmore & Israelsen

(57) ABSTRACT

A temperature control system is provided for efficiently controlling the temperature of an optical transmitter such as a laser diode. The temperature control system of the present invention reduces power consumption and achieves a higher efficiency by employing a voltage controller and a high-efficiency DC-DC step-down converter between the TEC controller, which drives the thermoelectric cooler, and the microcontroller, which governs the optical transmitter operation. The voltage controller converts an analog voltage command signal into a current-based command signal, which is then sent to the DC-DC step-down converter. The DC-DC converter produces a stepped-down voltage which it supplies to the TEC controller. The TEC controller receives the stepped-down voltage input from the DC-DC converter and outputs a corresponding current signal to the thermoelectric cooler. Because the current signal output by the TEC controller is proportional to the voltage signal it receives from the DC-DC converter, the current signal is reduced in magnitude. Upon receiving the current drive pulses, the thermoelectric cooler operates to stabilize the temperature of the laser diode.

20 Claims, 15 Drawing Sheets

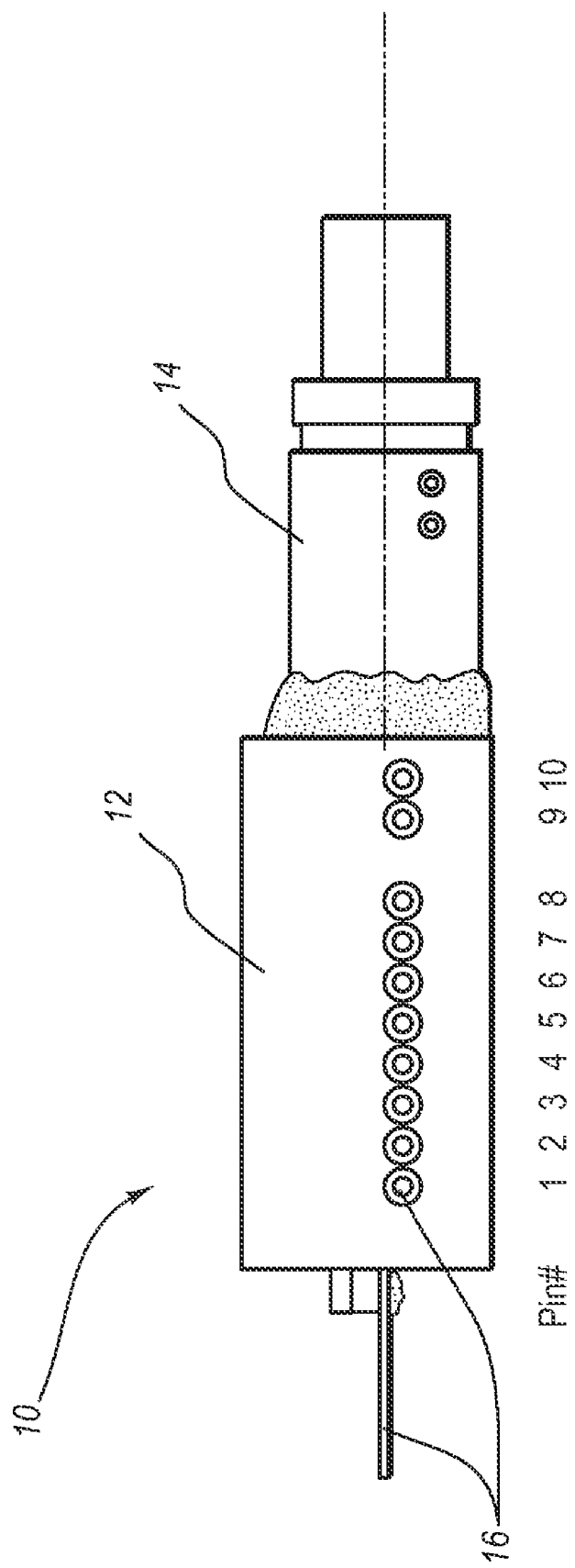

HIGH EFFICIENCY THERMOELECTRIC COOLER CONTROL SYSTEM

CROSS-REFERENCE TO RELATED APPLICATIONS

This application claims the benefit and priority of U.S. Provisional Application No. 60/869,707 entitled HIGH EFFICIENCY THERMOELECTRIC COOLER CONTROL SYSTEM filed Dec. 12, 2006, which is incorporated herein by reference in its entirety.

BACKGROUND

1. Technology Field

The present invention generally relates to optical modules including optical transmitters. In particular, the present invention relates to a control system for a thermoelectric cooler included in communications modules having optical transmitters such that power consumption of the TEC and module is efficiently controlled.

2. The Related Technology

Computing and networking technology have transformed our world. As the amount of information communicated over networks has increased, high-speed transmission has become ever more critical. Many high-speed data transmission networks rely on optical modules such as optical transceivers and similar devices for facilitating transmission and reception of digital data embodied in the form of optical signals over optical fibers. Optical networks are thus found in a wide variety of high-speed applications ranging from as modest as a small Local Area Network (LAN) to as grandiose as the backbone of the Internet.

Typically, data transmission in such networks is implemented by way of an optical transmitter (also referred to as an electro-optic transducer), such as a laser or Light Emitting Diode (LED). The electro-optic transducer emits light when current is passed there through, the intensity of the emitted light being a function of the current magnitude through the transducer. Data reception is generally implemented by way of an optical receiver (also referred to as an optoelectronic transducer), an example of which is a photodiode. The optoelectronic transducer receives light and generates a current, the magnitude of the generated current being a function of the intensity of the received light.

Various other components are also employed by the optical transceiver to aid in the control of the optical transmit and receive components, as well as the processing of various data and other signals. For example, such optical transceivers typically include an electro-optic transducer driver (e.g., referred to as a "laser driver" when used to drive a laser signal) configured to control the operation of the optical transmitter in response to various control inputs. The optical transceiver also generally includes an amplifier (e.g., often referred to as a "post-amplifier") configured to perform various operations with respect to certain parameters of a data signal received by the optical receiver. A controller circuit (hereinafter referred to the "controller") controls the operation of the laser driver and post amplifier.

Performance characteristics of an optical transmitter and receiver may vary in response to changes in operational conditions like temperature and voltage. Particularly, changes in temperature may affect the output wavelength of an LED or laser diode; i.e., as the laser temperature varies, a corresponding shift in wavelength of the optical signal simultaneously occurs. One way of controlling temperature of an LED or laser diode, and thereby stabilizing the wavelength of the optical signal, is by using a thermoelectric cooler (TEC).

Generally, a TEC is a device where current flow through the device will heat one side of the device while cooling the other side of the device. The side that is heated and the side that is cooled are controlled by the direction of the current flow. Thus, current flow in one direction will heat a first side while the same first side will be cooled when the current flow is reversed. Thus, by varying the current direction, a TEC connected to a laser or photodiode may be used to either heat or cool the laser or LED to maintain a constant operating temperature.

It is also desirable that the transceiver minimize power use. This is especially true in optical transceivers because various standards and multi source agreements (MSAs) dictate the amount of total power that may be consumed by an optical transceiver. However, TECs contribute to the overall power consumption of the optical transceiver module. Where applications or vendors require or desire relatively lower module power consumption, a need exists in the art for optical transmitter TEC systems that efficiently manage power usage so as to prevent undesired or excessive power requirements while effectively stabilizing the temperature of the laser.

BRIEF SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

As described herein, a temperature control system is provided for efficiently controlling the temperature of an optical transmitter such as a laser diode. One embodiment of the temperature control system reduces power consumption and achieves a higher efficiency by employing a voltage controller and a high-efficiency DC-DC step-down converter between the TEC controller, which drives the thermoelectric cooler, and the microcontroller, which governs the optical transmitter operation. This enables the TEC to be driven using lower voltages at greater efficiency. Using lower currents and voltages also has the advantage of reducing the power consumed by the device. Often the voltage is typically lowered such that the TEC can still operate.

Digital command signals sent by the microcontroller are received by a digital-to-analog converter (DAC) and converted from digital to analog format in preparation for reception thereof by the voltage controller. The DAC can be external or internal to the microcontroller, or the microcontroller can be configured to assert an analog command signal rather than a digital command signal obviating the need for a DAC.

The controller-originated analog command signals are typically in the form of voltage signals and are received by a voltage controller. The voltage controller converts the analog voltage command signal into a current-based command signal. This current-based command signal is then forwarded to a DC-DC step-down converter. The voltage controller may also receive as input a high current power supply that is used by the voltage controller in generating the signal provided to the DC-DC converter. In addition, a TEC efficiency control input can be used to inject a control signal to the voltage controller in order to improve the command signal that is forwarded by the voltage controller for control of the thermoelectric cooler. In one embodiment, the TEC efficiency control input is the same as the output of output received from the controller.

In one embodiment, the DC-DC converter is configured as a high efficiency step-down converter capable of modifying a received high current power supply. The DC-DC converter receives a high current power supply and the current-based command signal from the voltage controller. Using this control input, the DC-DC converter modifies the high current power supply and produces a stepped-down voltage for eventual control of the thermoelectric cooler. After modifying the power supply to a stepped-down voltage, the DC-DC converter supplies this stepped-down voltage to the TEC controller. The magnitude of the step down in the supply voltage is governed by the current-based command signal received by the DC-DC converter from the voltage controller, as described above.

In one implementation, the power supply received by the DC-DC converter is associated with a voltage of approximately 3.3 volts. According to the analog, current-based command signal sent by the voltage controller, the DC-DC converter reduces this voltage to a lower voltage, such as approximately 1.X volts. This process is in contrast to known temperature control systems wherein a supply voltage is forwarded to the TEC more directly without modification. Thus, the voltage controller can convert the DAC voltage output into a current and control the DC-DC step-down converter output voltage.

As stated above, the output from the DC-DC converter is a stepped-down voltage. This stepped-down voltage is received by the TEC controller, which is employed to drive the thermoelectric cooler during transceiver operation. Like the voltage controller, the TEC controller receives as input a voltage-based signal and outputs a current-based signal. Specifically, the TEC controller receives the stepped-down voltage input from the DC-DC converter and outputs a corresponding current signal to the thermoelectric cooler.

Because the current signal output by the TEC controller may be proportional to the voltage signal it receives from the DC-DC converter, the current signal is reduced in magnitude. This reduced current signal is pulsed as a drive signal in one embodiment from the TEC controller to the thermoelectric cooler. These current drive pulses, however, differ from conventional systems in that they are lessened in magnitude and lengthened in relative pulse time. Upon receiving the current drive pulses, the thermoelectric cooler operates to stabilize the temperature of the laser diode.

These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof that are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIG. 1 is a side view of a transmitter optical subassembly including an optical transmitter temperature control system configured in accordance with one embodiment of the present invention;

DETAILED DESCRIPTION OF SELECTED EMBODIMENTS

Reference will now be made to figures wherein like structures will be provided with like reference designations. It is understood that the drawings are diagrammatic and schematic representations of exemplary embodiments of the invention, and are not limiting of the present invention nor are they necessarily drawn to scale.

FIGS. 1-9 depict various embodiments or aspects of the present invention, which is generally directed to a high efficiency temperature control system for use in a communication module employing a light source, such as a laser diode. In one embodiment, the control system includes a thermoelectric cooler whose operation is efficiently controlled so as to cool or heat a laser diode in an optical transceiver module without causing excessive power consumption. The ability to drive a TEC with reduced current, can reduce power consumption, reduce inrush current during power on of the TEC system, prevent thermal runaway, reduce TEC switching noise, and improve TEC reliability.

In the embodiments to follow, an optical transceiver module ("transceiver") is disclosed that includes a transmitter optical subassembly ("TOSA") and a receiver optical subassembly ("ROSA"). The TOSA and ROSA include various components to enable the reception and transmission of optical signals to and from a host system that is operably connected to the transceiver. The host system can be included as a node in a communications network, for instance, and can employ the transceiver in communicating via optical signals with other components of the network. The discussion to follow regarding embodiments of the present invention should not be construed as a limiting of the application to such embodiments. Indeed, other types of communications modules, both optically and electrically based and having temperature controlled transmitters, can also benefit from the teachings of the present invention to be discussed herein.

Reference is first made to FIG. 1, which depicts a side view of an optical transmitter that is configured to include one embodiment of the present invention. In particular, FIG. 1 depicts a transmitter optical subassembly ("TOSA"), generally designated at 10. The TOSA 10 includes a housing 12 that defines a volume in which a laser diode (not shown is disposed). A nosepiece 14 is attached to the housing 12 and is configured to enable a connectorized optical fiber to be operably connected to the TOSA 10. A plurality of pins 16 extends from the housing 12 to enable operable connection of the TOSA 10 with various external components. The pins 16 can extend from the back of the TOSA 10, from the sides, from the bottom, or any combination thereof. The pins 16 can be adapted to conform to any relevant standard.

Figure 2A:
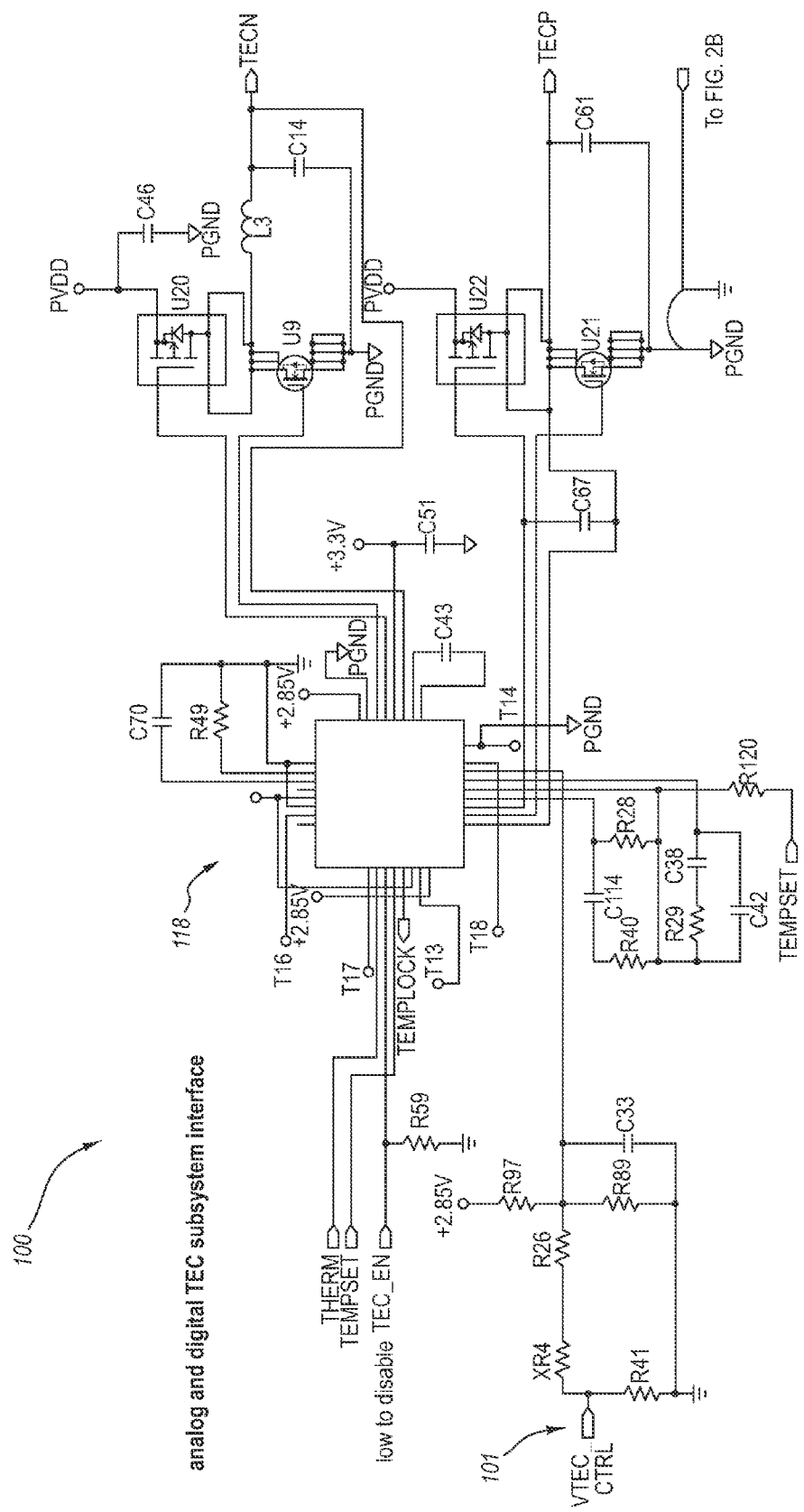
FIGS. 2A, 2B and 2C schematically depict various components that are included in the temperature control system according to one embodiment.
Figure 2B:
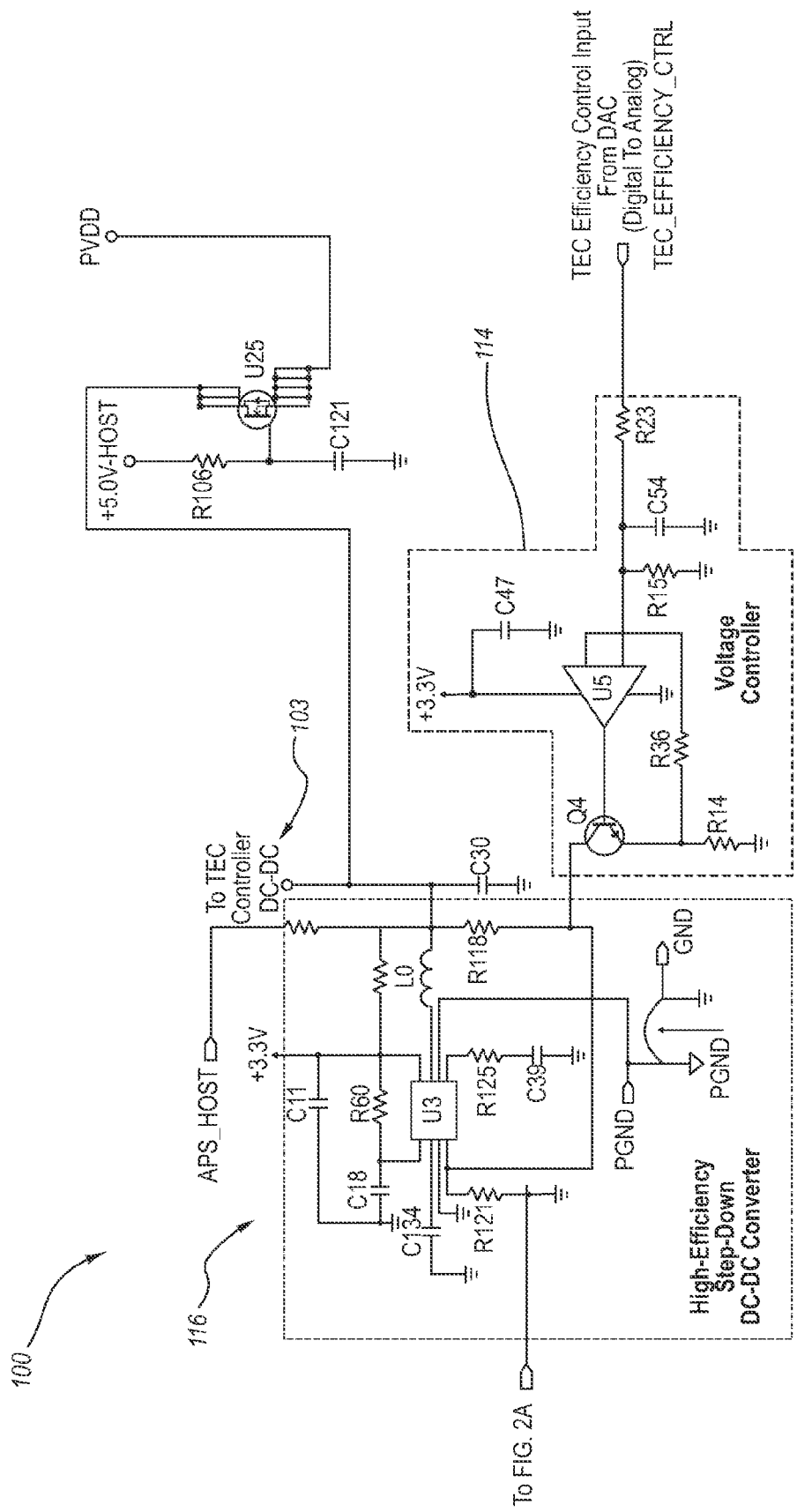
Figure 2C:
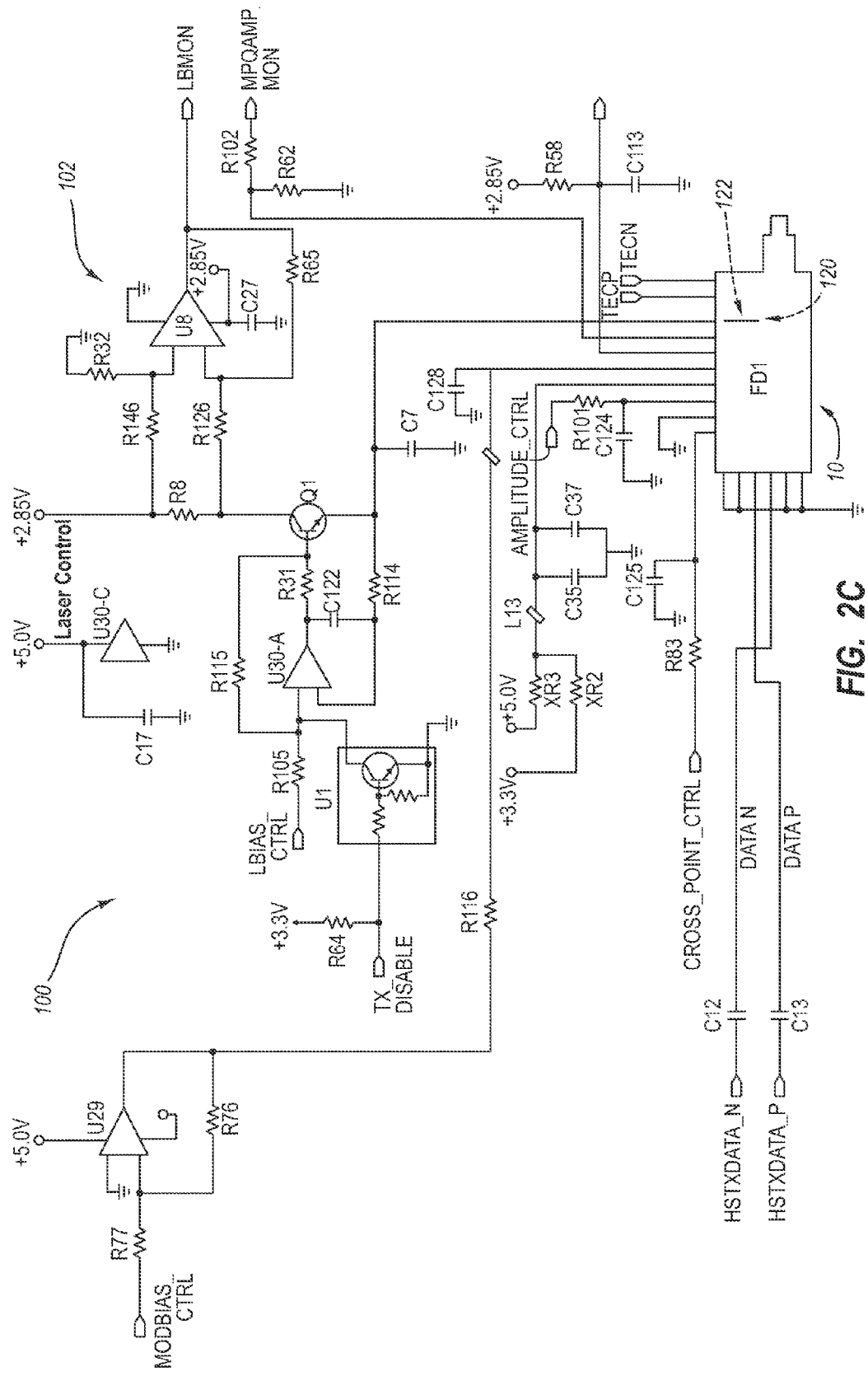

The TOSA 10 described above in one embodiment is included in an optical transceiver module, a portion of which is generally and schematically depicted at 100 in FIGS. 2A-2C. The optical transceiver portion is described here by way of illustration only, and not by way of restricting the scope of the invention. As mentioned above, the optical transceiver 100 in one embodiment is suitable for optical signal transmission and reception at a variety of per-second data rates, including but not limited to 1 Gbit, 2 Gbit, 2.5 Gbit, 4 Gbit, 8 Gbit, 10 Gbit, or higher bandwidth fiber optic links. Furthermore, embodiments of the present invention can be implemented in optical transceivers of any form factor such as, but not limited to, XFP, SFP, SFF, and X2, without restriction.

During operation, the optical transceiver receives electrical signals from a host (not shown) for transmission onto an optical fiber connected to the nosepiece 14, as described above. The laser diode housed within the TOSA 10 is driven so as to cause the TOSA to emit onto the optical fiber optical signals representative of the information in the electrical signal provided by the host. Accordingly, the TOSA 10, serves as an electro-optic transducer.

As shown in FIGS. 2A-2C, the transceiver portion 100 depicted here includes laser control circuitry 102 to govern operation of the laser diode, indicated in phantom at 122, which is disposed within the TOSA 10. A voltage controller 114 and DC-DC converter 116 are included in the transceiver portion 100, as is a TEC controller 118. The TEC controller 118 governs operation of a thermoelectric cooler ("TEC") 120, indicated in phantom in FIGS. 2A-2C. In one embodiment, the laser diode and the TEC are integrated into a single component.

Figure 3:
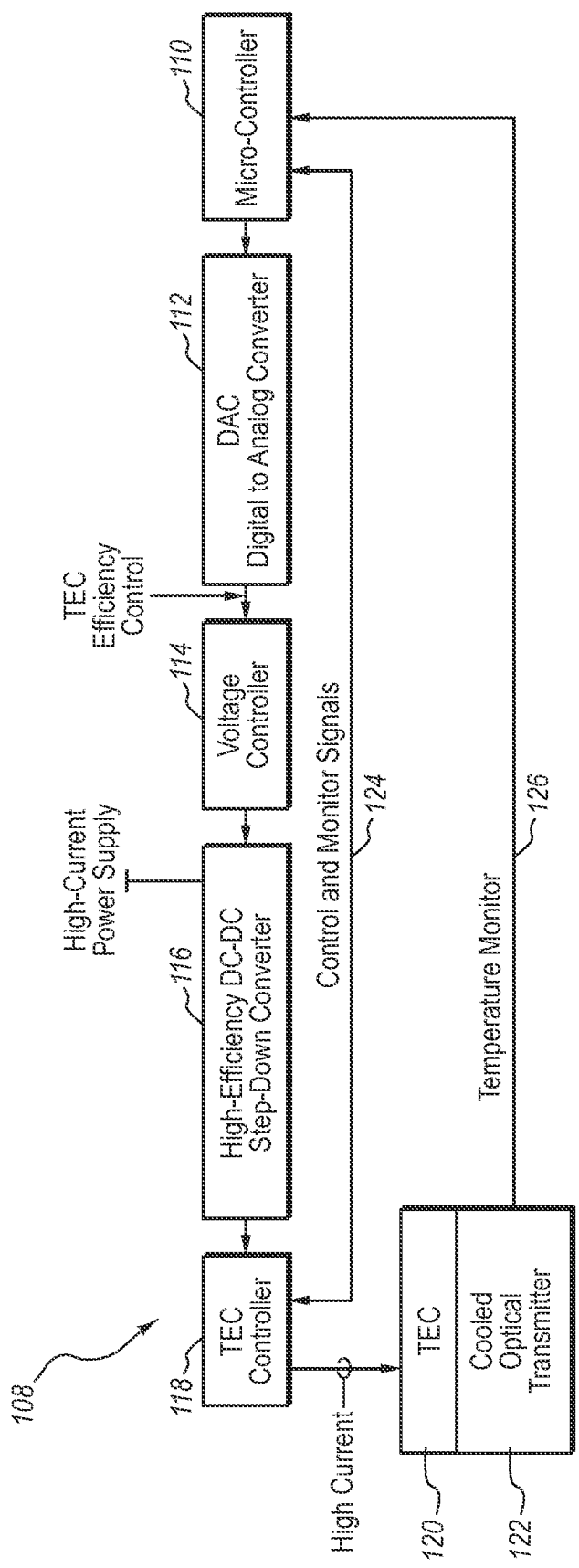
FIG. 3 is a simplified block diagram depicting various of the components shown in FIGS. 2A-2C.

Reference is now made to FIG. 3, which shows various details regarding a temperature control system ("system"), generally designated at 108, for governing the temperature of the laser diode 122 or other suitable optical transmitter. As shown in FIG. 3, the system 108 includes the TEC 120 that is operably attached with the laser 122 (indicated here as a "cooled optical transmitter"). The system 108 is further composed of a microcontroller ("controller") 110 and a digital-to-analog converter ("DAC") 112, together with the voltage controller 114, DC-DC converter 116 and TEC controller 118 mentioned above in connection with FIGS. 2A-2C. The above components cooperate in controlling the temperature of the laser 122 so as to ensure its proper operation during transceiver use, i.e., to prevent wavelength drift of its optical signal due to excessive heating or cooling and or maintenance of the laser diode at an ideal operational condition.

The controller 110 is employed in the system 108 to govern operation of the voltage controller 114 and may be solely dedicated for use by the system or may be shared by other components in the transceiver in governing additional transceiver operations. Examples of other components that could share the functionality of the controller or be controlled by the controller 110 include a laser driver and post amplifier of the transceiver. The controller 110 may include a processor capable of executing microcode or being otherwise programmable to accomplish various tasks as are described below. In the present embodiment, the controller processor is configured to implement logic digitally, while still largely interfacing with the rest of the optical transceiver 100 using analog signals. The various interfaces described herein can include analog and/or digital signals.

Digital command signals sent by the controller 110 are received by the DAC 112 and converted from digital to analog format in preparation for reception thereof by the voltage controller 114. In another embodiment, the controller can include an internal DAC that converts the digital command signals into analog format, making the external DAC 112 unnecessary. In other words, the DAC 112 can be integrated with the controller 114. In yet another embodiment, the controller 110 may be configured to issue its command signals in analog format.

The controller-originated analog command signals produced by the DAC 112 are typically in the form of voltage signals. These voltage signals are received by the voltage controller 114. As an interface between the DAC 112 and DC-DC converter 116, the voltage controller 114 provides the signals necessary to control the output voltage that will govern TEC operation via the TEC controller.

In greater detail, the voltage controller 114 converts the analog voltage command signal received from the DAC 112 into a current-based command signal. This current-based command signal is then forwarded or input to or used by the DC-DC converter 116. In addition, the DC-DC converter receives, as input, a high current power supply that is used by the DC-DC converter 116.

FIG. 3 also shows a TEC efficiency control input between the DAC 112 and voltage controller 114. In one example, the input to the voltage controller 14 from the DAC 1112 is the TEC efficiency control input. This input can be a control signal to the voltage controller 114 in order to improve the command signal that is output by the voltage controller for control of the TEC 120.

In one embodiment, the DC-DC converter 116 is configured as a high efficiency step-down converter capable of modifying a received high current power supply. As mentioned, the DC-DC converter 116 receives a high current power supply, as shown in FIG. 3. The DC-DC converter 116 also receives the current-based command signal from the voltage controller 114. Using this current-based command signal, the DC-DC converter 116 modifies the high current power supply and produces a stepped-down voltage for eventual control of the TEC 120. After modifying the power supply to a stepped-down voltage, the DC-DC converter 116 supplies this stepped-down voltage to the TEC controller 118. The magnitude of the step down in the supply voltage is governed by the current-based command signal received by the DC-DC converter 116 from the voltage controller, as described above.

In one implementation, the power supply received by the DC-DC converter 116 is associated with a voltage of approximately 3.3 volts. According to the analog, current-based command signal sent by the voltage controller 114, the DC-DC converter 116 reduces this voltage to a lower voltage, such as approximately 1.X volts. The range of the voltage output by the DC-DC converter, in one embodiment, is between 1 and 2 volts or between 1 and 1.5 volts. One of skill in the art, with the benefit of the present application, can appreciate that the lower end of the voltage range (which may be lower than 1 volt), needs to be sufficient to allow the TEC to operate. This process is in contrast to known TEC systems wherein a supply voltage is forwarded to the TEC more directly without modification.

As stated above, the output from the DC-DC converter 116 is a stepped-down voltage. This stepped-down voltage is received by the TEC controller 118, which is employed to drive the TEC 120 during transceiver operation. Like the voltage controller 114 already discussed, the TEC controller 118 receives as input a voltage-based signal and outputs a current-based signal. Specifically, the TEC controller receives the stepped-down voltage input from the DC-DC converter 116 and outputs a corresponding current signal to the TEC 120.

Because the current signal output by the TEC controller 118 is proportional to the voltage signal it receives from the DC-DC converter 116, the current signal is reduced in its magnitude. This current signal is pulsed as a drive signal in the present embodiment from the TEC controller 118 to the TEC 120. Generating a pulse may require switching in some instances. Advantageously, these current drive pulses, however, differ from prior art systems in that they are lessened in magnitude and lengthened in relative pulse time. As a result, the reliability of the TEC is improved and the TEC switching noise is reduced. Further, the power consumption over temperature is also reduced.

Upon receiving the current drive pulses, the TEC 120 operates to stabilize the temperature of the laser diode 122. Note that while described here as a laser diode, the optical transmitter that is cooled/heated by the TEC can be another type of transmitter or even a passive component of a communication module or telecommunications equipment. Thus, the principles of the present invention can be broadened over what is explicitly described herein.

A control line 124 is included in the system 108, which operably interconnects the controller 110 with the TEC controller so as to enable control and monitor signals to passed therebetween. Also, a monitor line 126 extends between the laser diode 122 and the controller 110 to enable the controller to monitor the temperature of the laser diode during transceiver operation so as to control TEC operation. These controls can be used, by way of example and not limitation, to set the temperature of the TEC or to set the desired temperature of the laser that the TEC is to achieve, provide voltage reference signals, identify thermal faults, identify the current temperature of the laser diode, indicate when the desired temperate has been reached, measure the difference between the target and object temperatures, stabilize temperature stabilizing time, setting a switching frequency, and the like or any combination thereof.

Figure 4:
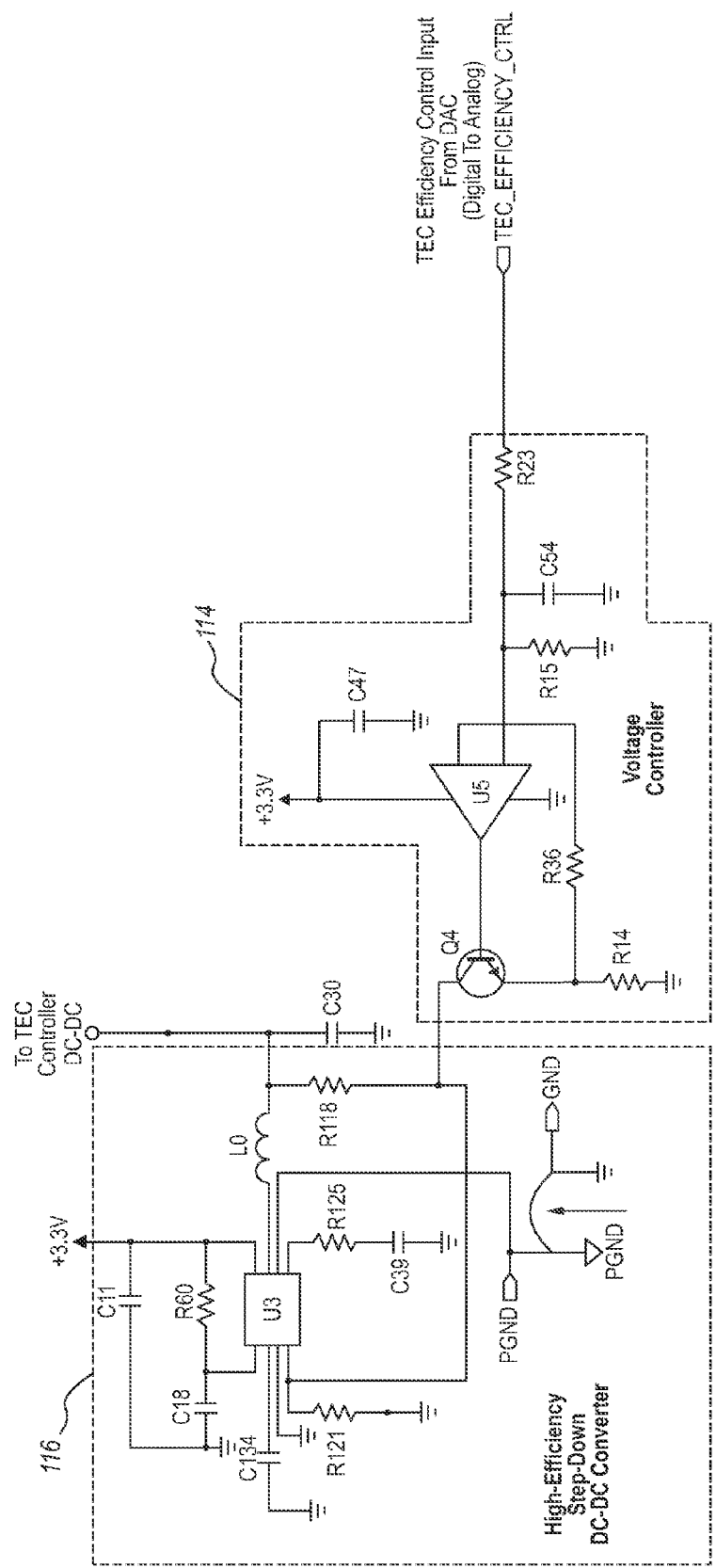
FIG. 4 is a schematic drawing showing in greater detail certain components depicted in FIGS. 2A-2C.

FIG. 4 shows the voltage controller 114 and DC-DC converter 116 in schematic format, showing the circuitry of each. Inclusion and operation of these components within the temperature control system 108 of the transceiver enables a greater power consumption efficiency to be achieved not only for the system 108 but for the transceiver as a whole. This greater power consumption efficiency results from the voltage step-down operation performed by the DC-DC converter 116 on the power supply and the resultant reduced-strength current drive pulses provided to the TEC 120 by the TEC controller 118. In one implementation, this greater efficiency results in an overall transceiver power consumption of less than 4 watts in one embodiment, representing up to a 90% power consumption efficiency in some examples. In this example, the voltage controller 114 receives an input TEC efficiency control from the DAC. The output is a current signal generated, in this example, with a transistor. The current output serves as the input to the DC-DC converter 116, which generates an output to the TEC controller.

Figure 5A:
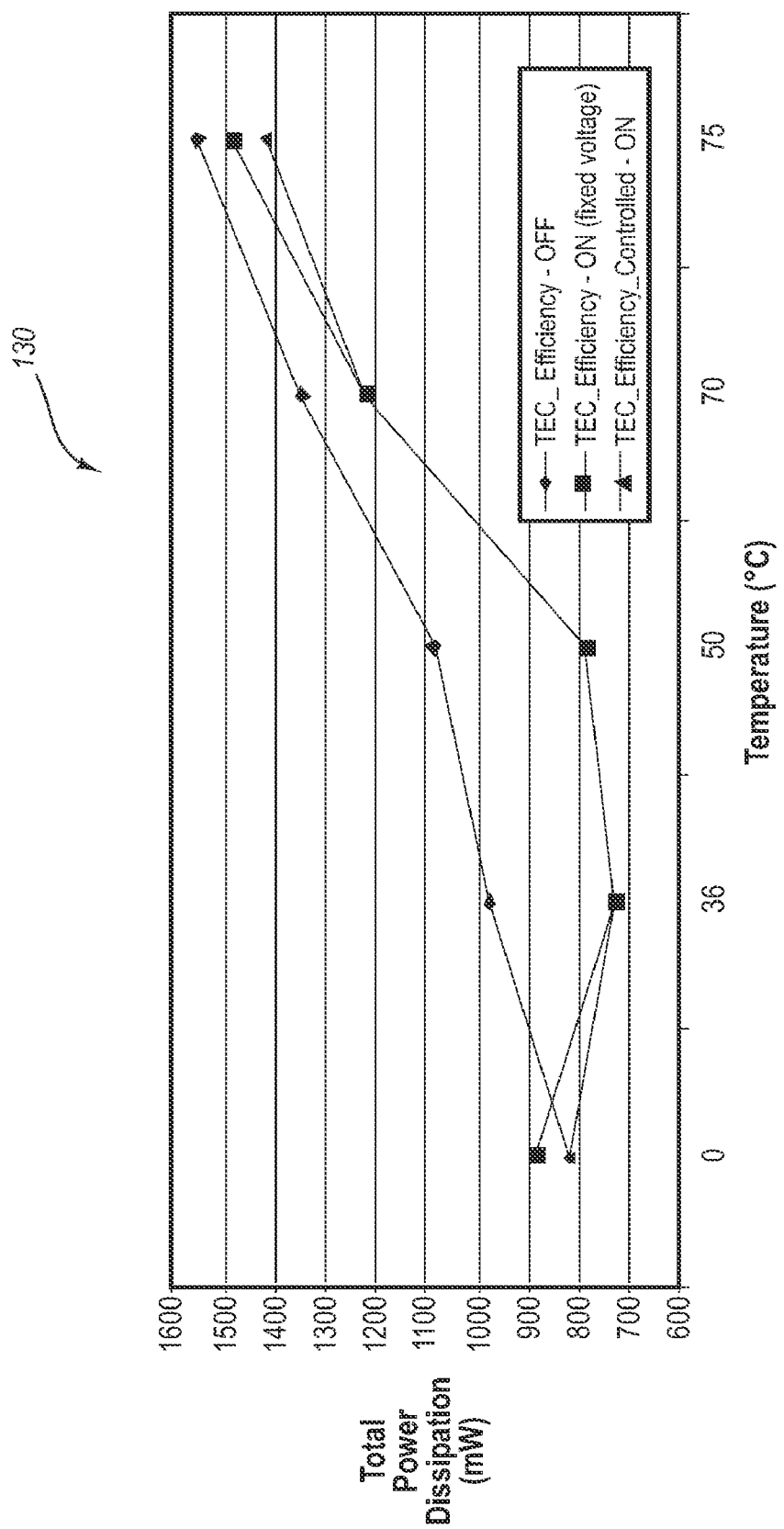
FIG. 5 depicts two graphs showing favorable results achieved by practice of an embodiment of the present invention.
Figure 5B:
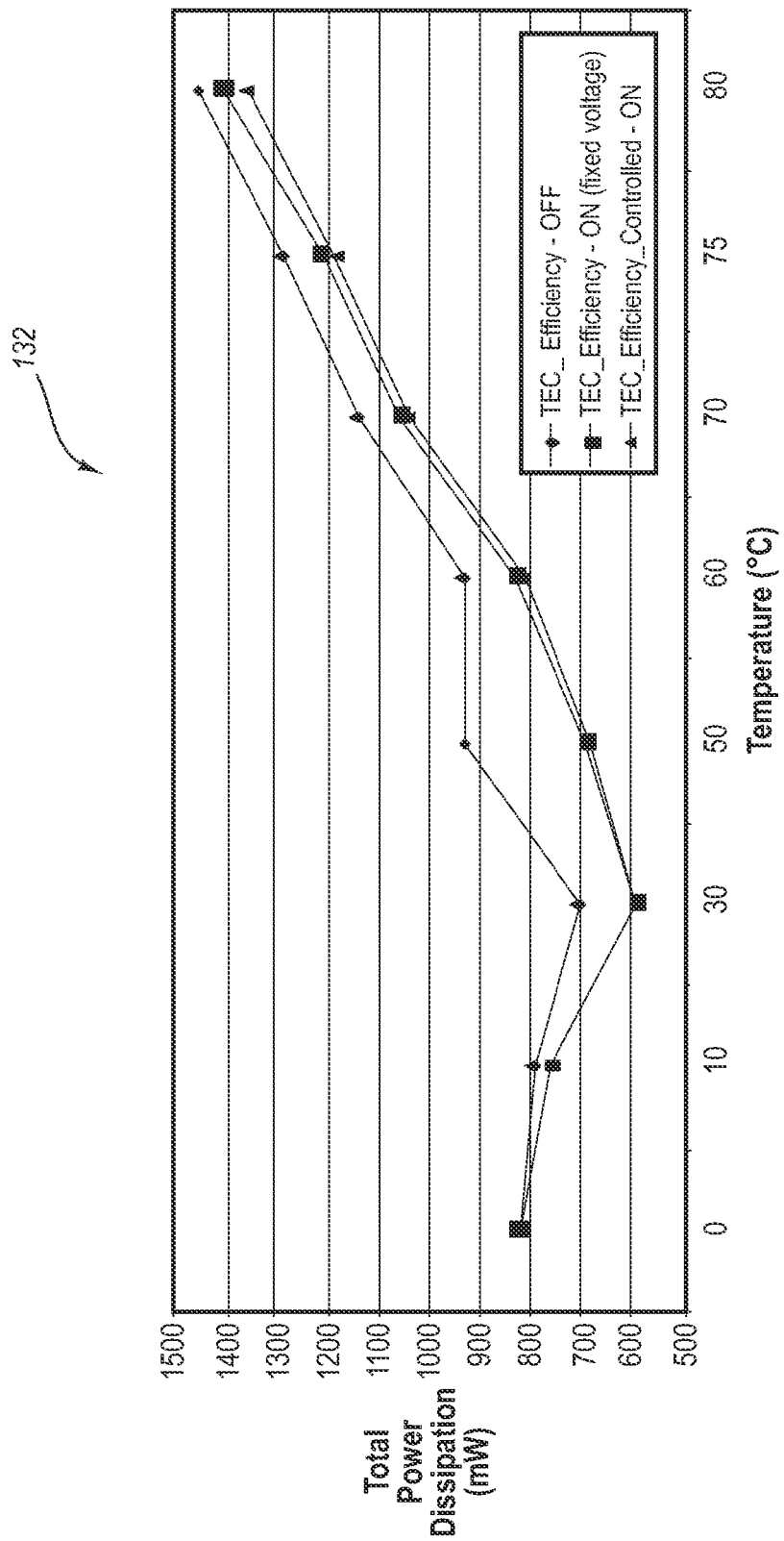

FIGS. 5A and 5B depict two graphs 130 and 132, respectively, showing the effect of practice of an embodiment of the present invention. FIGS. 5A and 5B illustrate that the TEC efficiency input from the DAC can be a fixed voltage or can be controlled. As can be seen, total power dissipation of the module receiving an initial TEC power supply of 3.3 volts is substantially reduced via use of a high efficiency temperature control system of an embodiment of the present invention over a module not employing such a system. Advantageously, this efficiency in power dissipation is realized over a range of possible module operating temperatures.

Figure 6A:
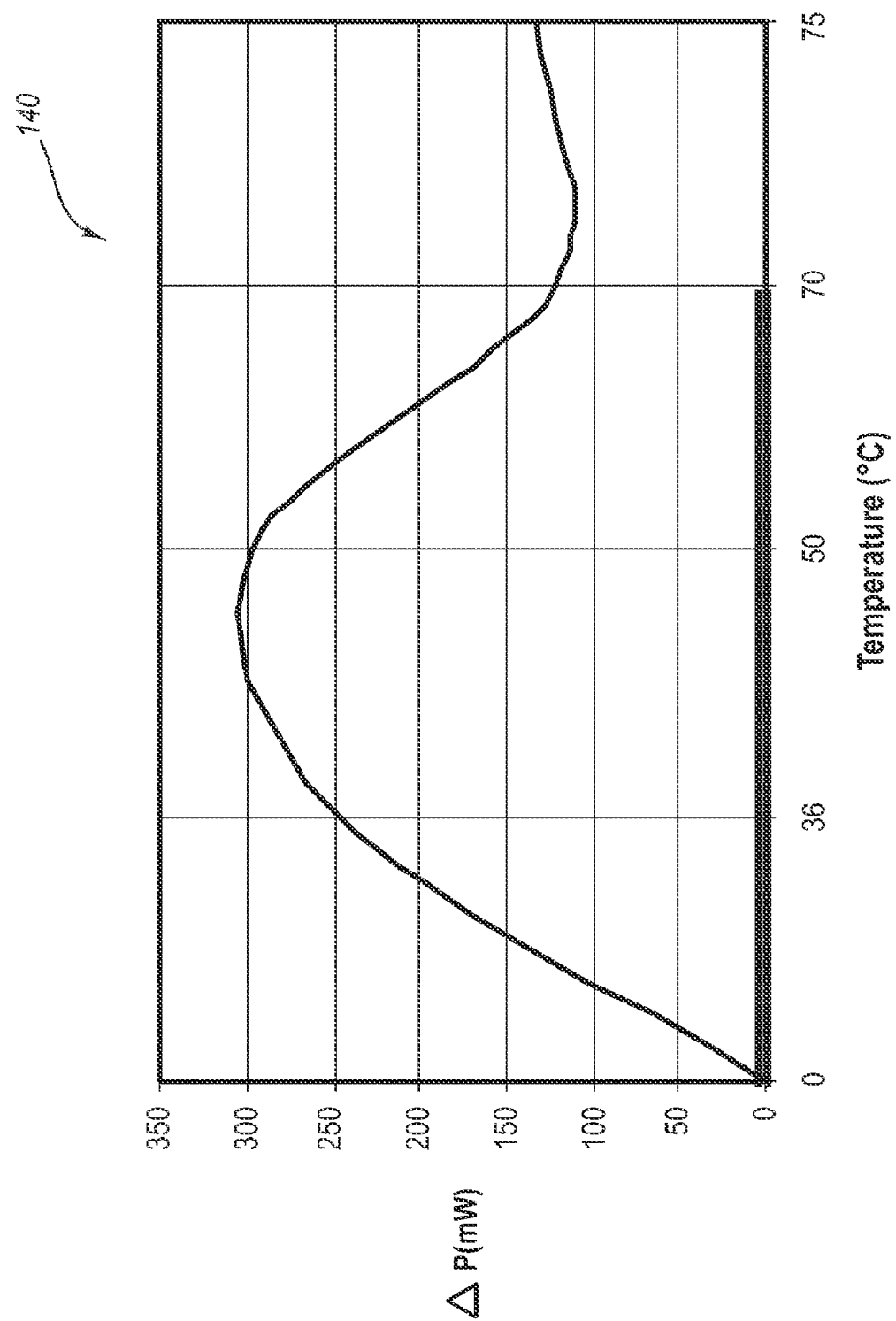
FIG. 6 depicts two graphs showing more favorable results achieved by practice of an embodiment of the present invention.
Figure 6B:
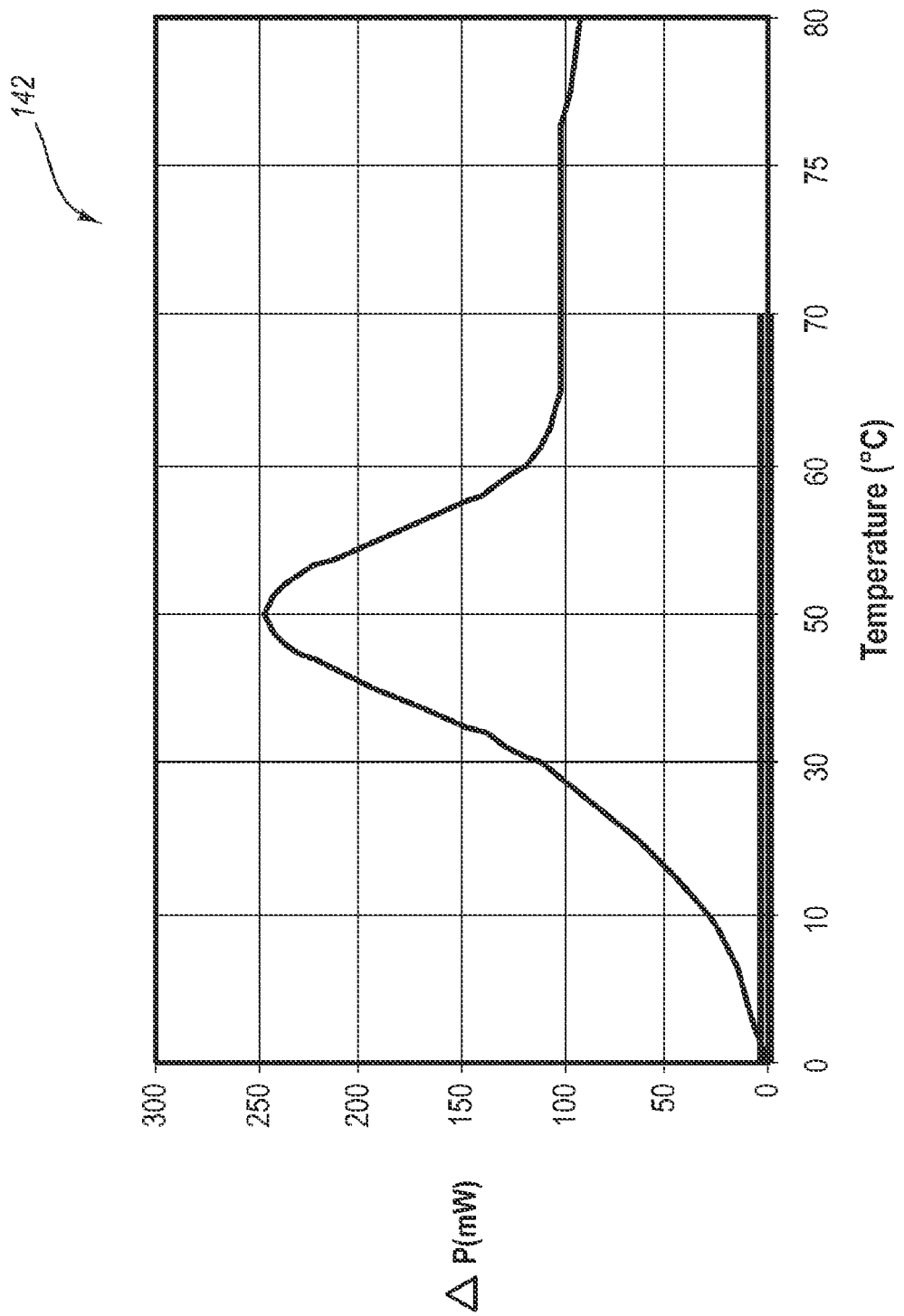

FIGS. 6A and 6B depicts two graphs 140 and 142, respectively, that demonstrate the range of power dissipation improvement over modules not having the temperature control system described herein, according to the examples 1 and 2 shown in graphs 130 and 132 in FIGS. 5A and 5B. FIG. 6A illustrates, for example, about 110 mW power dissipation improvement at 70 degrees C. and about 250 mW power dissipation improvement at 50 degrees C.

The temperature control system as described herein offers several features and advantages over conventional TEC configurations. The system as described is adaptable to operate with TECs of various types and configurations. To enable such adaptation, the DC-DC converter can be adjusted so as to receive a power supply of a predetermined voltage and to output a predetermined stepped-down voltage. Thus it is seen that the DC-DC converter is programmable according to the resistance configuration and other needs of the TEC. In some instances, the DC-DC converter can be reprogrammed via the controller after the module is manufactured, during operation, and the like.

The temperature control system reduces overall power consumption of the TEC over a range of operating temperatures via greater operating efficiencies. This improvement in power consumption is computed, in one example, as the difference between the power efficiencies of the TEC controller and the DC-DC converter multiplied by the total power consumption of the TEC system. The control line 124 of FIG. 3, established between the controller and the TEC controller, enables the operation of the TEC controller to be tuned for any given temperature encountered in the transceiver.

Another benefit lies in the lower strength current drive pulses provided to the TEC by the TEC controller. Because these drive pulses are lower strength than pulses provided without the present invention, stress to the TEC is lessened, resulting in longer life expectancy and greater reliability for the TEC.

Figure 7A:
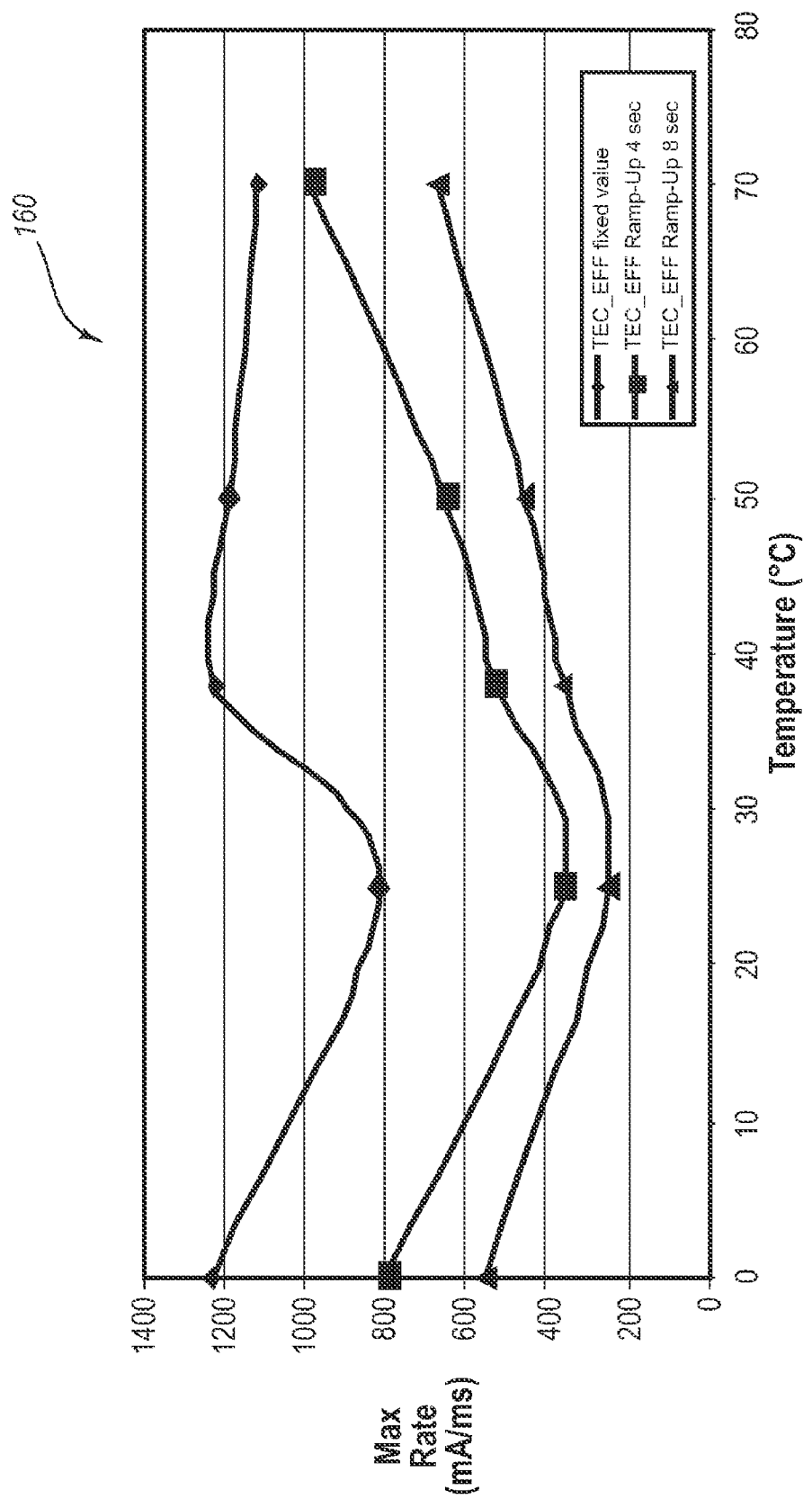
FIG. 7 depicts two graphs showing favorable inrush current results achieved by practice of an embodiment of the present invention.
Figure 7B:
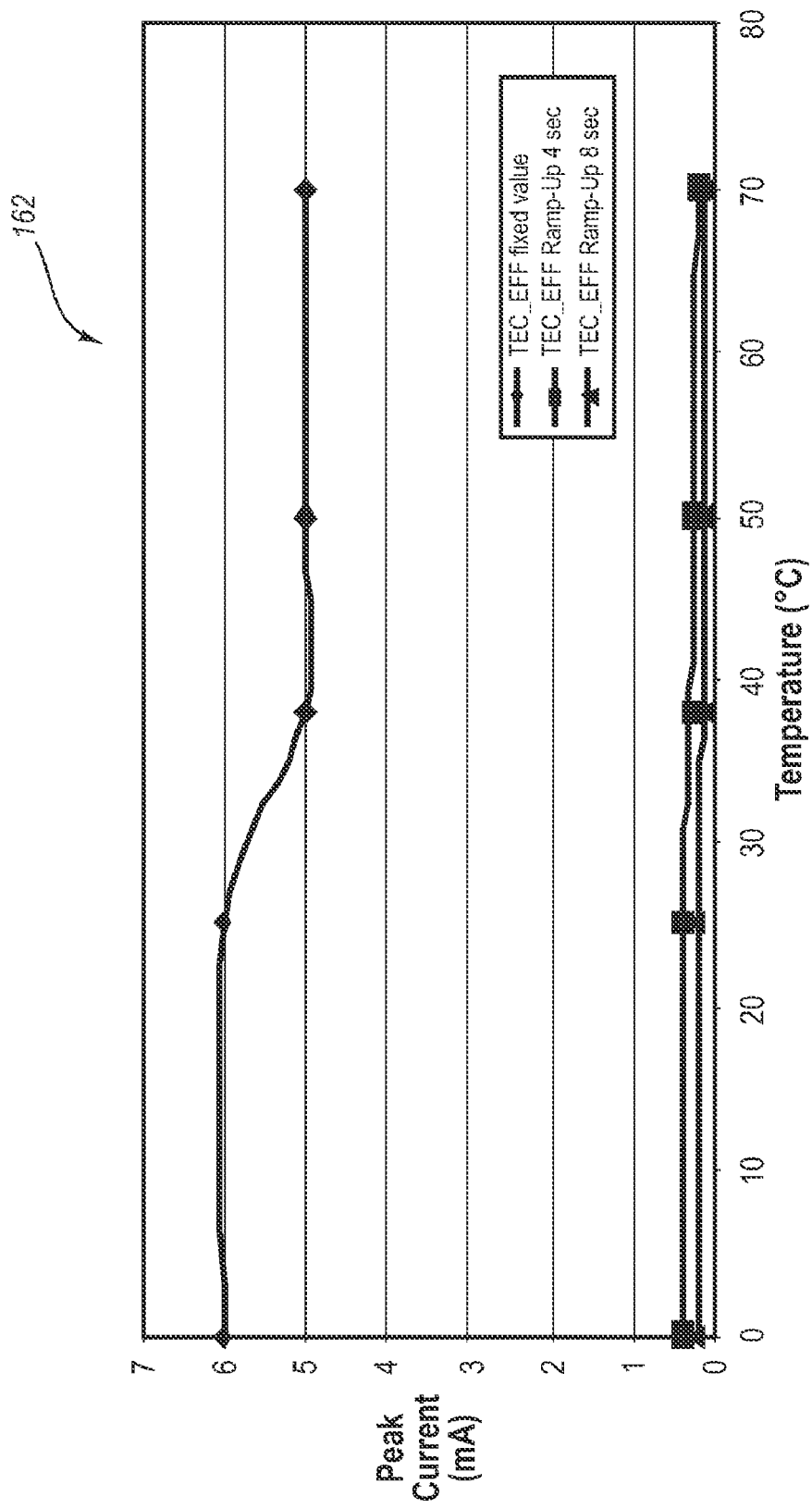
Figure 8A:
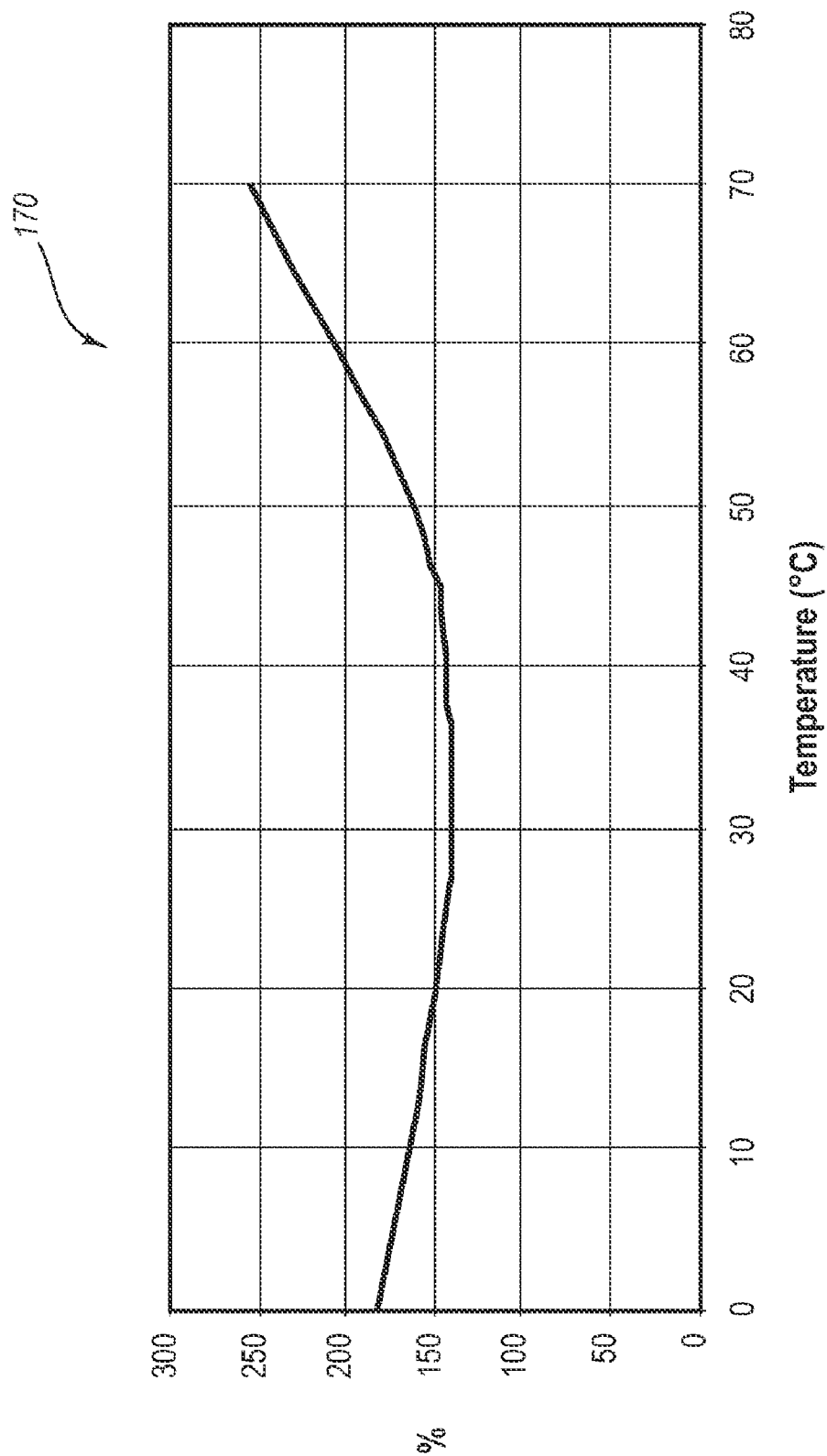
FIG. 8 depicts two graphs showing the improvement in inrush current performance achieved by practice of an embodiment of the present invention.
Figure 8B:
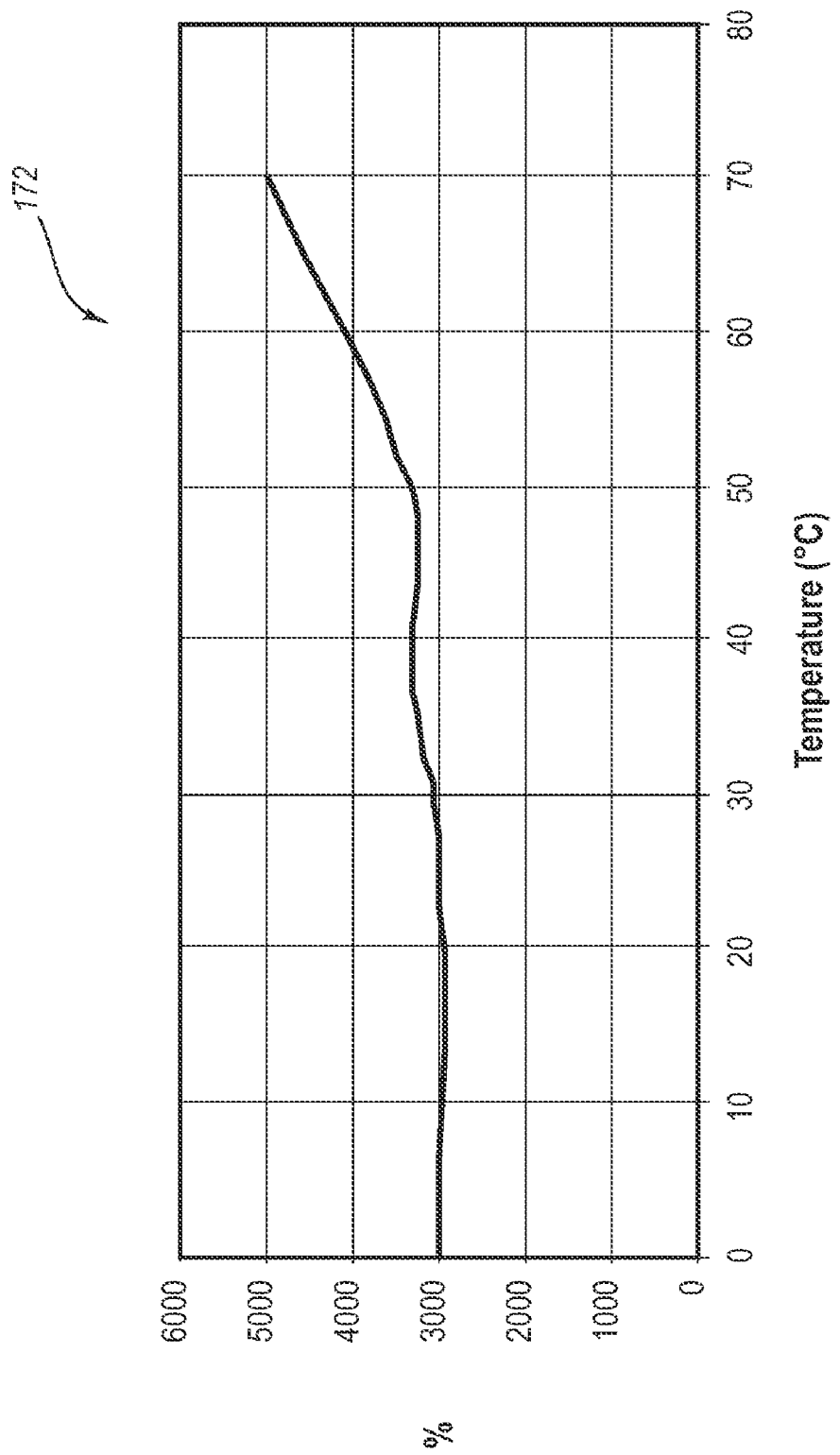

Inrush current, or the current demand for the transceiver or by the TEC at startup is also lessened as a result of use of embodiments of the present invention. When the TEC is started, the initial difference between the desired operating temperature and the current temperature can result in a demand for a large current. This is one example of the inrush current in a TEC. In particular, the temperature control system 108 described above can be programmed such that the voltage supplied by the DC-DC converter is ramped up slowly over time, providing only the amount necessary to enable operation of the TEC. This in turn lessens the TEC's current draw during the startup period. Some of these advantages are depicted in graphs 160 and 162 of FIGS. 7A and 7B, and graphs 170 and 172 of FIGS. 8A and 8B. FIG. 7A the reduction in the peak inrush current when the TEC input is fixed compared to a ramp up over time. FIG. 7B illustrates a substantial reduction in the maximum current ramp rate. FIG. 8A illustrates a 150% improvement of peak inrush current and FIG. 8B illustrates a large (on the order of 3000%) improvement in the maximum inrush current ramp rate improvement.

Figure 9:
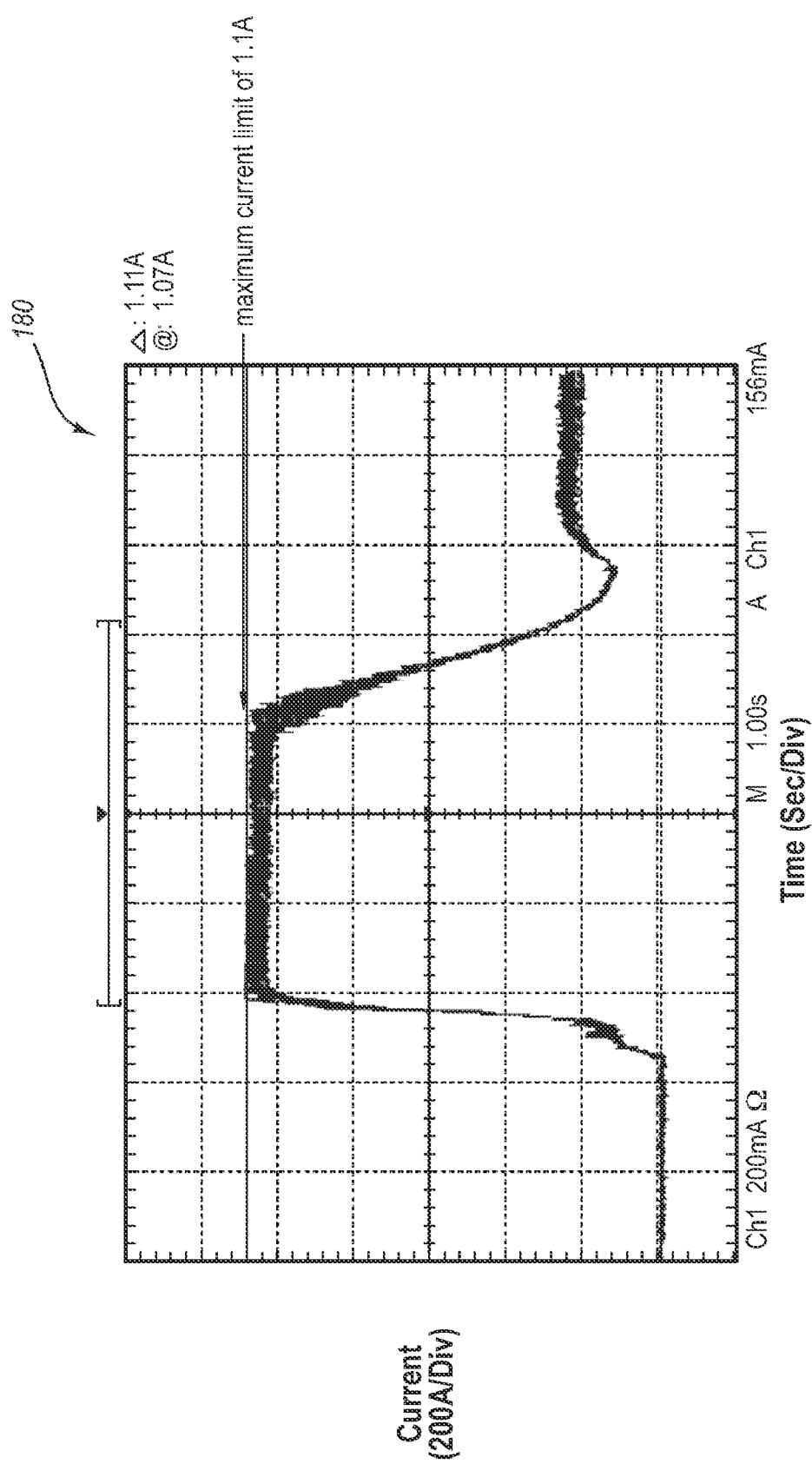
FIG. 9 graphically represents a power supply current limiting feature included in an embodiment of the present invention.

In addition, embodiments of the present invention protect the TEC from positive thermal feedback and thermal runaway by limiting its supply voltage or current in the manner described above. Further, in one embodiment extra protection is achieved in this area by programming the maximum voltage to be output by the DC-DC converter, resulting in a limited current to the TEC. This could be accomplished, for instance, by the controller or by dedicated circuitry in the DC-DC converter or other suitable component. FIG. 9 shows the results of such limiting in graph 180, wherein the current supplied to the TEC is limited to a predetermined level. This also has applicability when relatively high or low temperature conditions are detected by the controller via the temperature monitor line 126. In such a case, the voltage to be output by the DC-DC converter would be set low by the controller. Note that TEC switching noise is also reduced by the temperature control system.

In one alternative embodiment of the present invention, integration of portions of the temperature control system can be achieved. For instance, the voltage controller and DC-DC converter could be included internally within the TEC controller or the TEC itself. This integration could enable these components to be brought within the package of the TOSA itself.

The present invention may be embodied in other specific forms without departing from its spirit or essential characteristics. The described embodiments are to be considered in all respects only as illustrative, not restrictive. The scope of the invention is, therefore, indicated by the appended claims rather than by the foregoing description. All changes that come within the meaning and range of equivalency of the claims are to be embraced within their scope.

What is claimed is:

1. A temperature control system for efficiently controlling a temperature of an optical transmitter, comprising:
   a voltage controller that generates a current-based output in response to a voltage-based microcontroller command;
   a DC-DC converter that receives the current-based output from the voltage controller and generates a stepped down voltage-based output;
   a TEC controller that receives the stepped down voltage-based output from the DC-DC converter and generates current drive pulses for driving a thermoelectric cooler.

2. The temperature control system of claim 1, wherein the DC-DC step-down converter and the voltage controller are integrated in the TEC controller.

3. The temperature control system of claim 1, wherein the DC-DC step-down converter and the voltage controller are integrated in the thermoelectric cooler.

4. The temperature control system of claim 1, further comprising a TEC efficiency signal input to the voltage controller as a control signal to improve the current-based output of the voltage controller.

5. The temperature control system of claim 1, further comprising a control line which operably connects the microcontroller with the TEC controller to enable control and monitor signals to be passed there between.

6. The temperature control system of claim 1, further comprising a monitor line which operably connects the microcontroller with the optical transmitter so as to enable microcontroller to monitor the temperature of the optical transmitter during operation for the purpose of controlling the thermoelectric cooler.

7. The temperature control system of claim 1, wherein the total power consumption efficiency is as high as 90%.

8. The temperature control system of claim 1, wherein the stepped down voltage-based output from the DC-DC converter is adjustable such that it may be configured according to a thermoelectric cooler resistance configuration.

9. The temperature control system of claim 1, wherein the stepped down voltage-based output from the DC-DC converter may be limited, thereby limiting the input to the TEC controller such that the thermoelectric cooler is protected from positive thermal feedback and thermal runaway.

10. A temperature control system for efficiently controlling a temperature of an optical transmitter, comprising:
    a voltage controller;
    a DC-DC converter connected to the voltage controller;
    a TEC controller connected to the DC-DC converter;
    a thermoelectric cooler controlled by the TEC controller; and
    a microcontroller that outputs a voltage-based command signal to the voltage controller,
    wherein the voltage controller converts the voltage-based command signal into a current-based command signal and outputs the current-based command signal to the DC-DC step-down converter,
    wherein the DC-DC step-down converter converts the received current-based command signal into a stepped down voltage-based command signal and outputs the stepped down voltage-based command signal to the TEC controller,
    wherein the TEC controller converter converts the received stepped down voltage-based command signal into current drives pulses which are output to the thermoelectric cooler for the purpose of driving the operation of the thermoelectric cooler,
    wherein the current drive pulses driving the operation of the thermoelectric cooler are reduced in magnitude compared to the current-based command signal output by the voltage controller.

11. The temperature control system of claim 10, wherein the stepped down voltage-based command signal is less than 2 volts.

12. The temperature control system of claim 10, wherein the DC-DC step-down converter and the voltage controller are integrated in the thermoelectric cooler.

13. The temperature control system of claim 10, further comprising a TEC efficiency signal input to the voltage controller as a control signal to improve the current-based output of the voltage controller.

14. The temperature control system of claim 10, further comprising a control line which operably connects the microcontroller with the TEC controller so as to enable control and monitor signals to be passed there between.

15. The temperature control system of claim 10, further comprising a monitor line which operably connects the microcontroller with the optical transmitter so as to enable microcontroller to monitor the temperature of the optical transmitter during operation for the purpose of controlling the thermoelectric cooler.

16. The temperature control system of claim 10, wherein the total power consumption efficiency is as high as 90%.

17. The temperature control system of claim 10, wherein the stepped down voltage-based output from the DC-DC converter is adjustable such that it may be configured according to a thermoelectric cooler resistance configuration.

18. The temperature control system of claim 10, wherein the stepped down voltage-based output from the DC-DC converter may be limited, thereby limiting the input to the TEC controller such that the thermoelectric cooler is protected from positive thermal feedback and thermal runaway.

19. A method for efficiently controlling a power consumption of an optical transmitter temperature control system, comprising:
    sending a voltage-based command signal from a microcontroller to a voltage controller;
    converting the voltage-based command signal to a current-based command signal with the voltage controller;
    sending the current-based command signal from the voltage controller to the DC-DC converter;
    converting the current-based command signal into a stepped-down voltage-based command signal with the DC-DC converter;
    sending the stepped-down voltage-based command signal to a TEC Controller; and
    using the TEC Controller to drive a TEC with the stepped-down voltage-based command signal.

20. The method of claim 19, further comprising ramping the TEC to control an inrush current.

* * * * *